United States Patent [19]

Tanaka et al.

[11] Patent Number: 5,114,869
[45] Date of Patent: May 19, 1992

[54] METHOD FOR PRODUCING REVERSE STAGGERED TYPE SILICON THIN FILM TRANSISTOR

[75] Inventors: Sakae Tanaka; Yoshiaki Watanabe, both of Tokyo; Katsuo Shirai; Yoshihisa Ogiwara, both of Tochigi, all of Japan

[73] Assignees: Seikosha Co., Ltd.; Nippon Precision Circuits Ltd., both of Tokyo, Japan

[21] Appl. No.: 358,039

[22] Filed: May 26, 1989

[30] Foreign Application Priority Data

May 30, 1988 [JP] Japan .................. 63-132090

[51] Int. Cl.$^5$ .................................. H01L 21/265
[52] U.S. Cl. .................. 43/40; 437/101; 437/20; 437/21; 357/2; 357/4; 357/23.7
[58] Field of Search ............ 437/40, 41, 43, 101, 437/20, 21, 24; 357/4, 23.7, 2

[56] References Cited

U.S. PATENT DOCUMENTS

| 4,459,739 | 7/1984 | Shepherd et al. | 437/20 |
| 4,704,623 | 11/1987 | Piper et al. | 357/23.7 |
| 4,759,610 | 7/1988 | Yanagisawa | 357/23.7 |
| 4,862,234 | 8/1989 | Koden | 357/4 |
| 4,916,090 | 4/1990 | Motai et al. | 437/101 |

FOREIGN PATENT DOCUMENTS

| 0301463 | 2/1989 | European Pat. Off. | 437/21 |
| 0005579 | 1/1986 | Japan | 357/23.7 |
| 0178559 | 7/1988 | Japan | 357/23.7 |
| 0193568 | 8/1988 | Japan | 357/23.7 |
| 0120070 | 5/1989 | Japan | 357/23.7 |
| 0149477 | 6/1989 | Japan | 357/23.7 |

Primary Examiner—Olik Chaudhuri
Assistant Examiner—M. Wilczewski
Attorney, Agent, or Firm—Jordan and Hamburg

[57] ABSTRACT

A method for producing a reverse staggered type silicon thin film transistor includes the steps of forming a gate insulating layer on a substrate having a gate electrode, the gate insulating layer having a transistor-forming portion; forming an intrinsic silicon film on the transistor-forming portion of the gate insulating layer; forming an n-type silicon layer on the intrinsic silicon layer; forming a source electrode on the n-type silicon layer; forming a drain electrode on the n-type silicon layer; forming a resist layer on the source electrode and drain electrode and having the same shape thereof; subsequently removing a portion of the n-type silicon layer by using the resist layer as a mask, such that there remains a predetermined thickness of the n-type silicon layer; and doping the predetermined thickness of the n-type silicon layer with p-type impurities by using the resist layer as a mask.

13 Claims, 3 Drawing Sheets

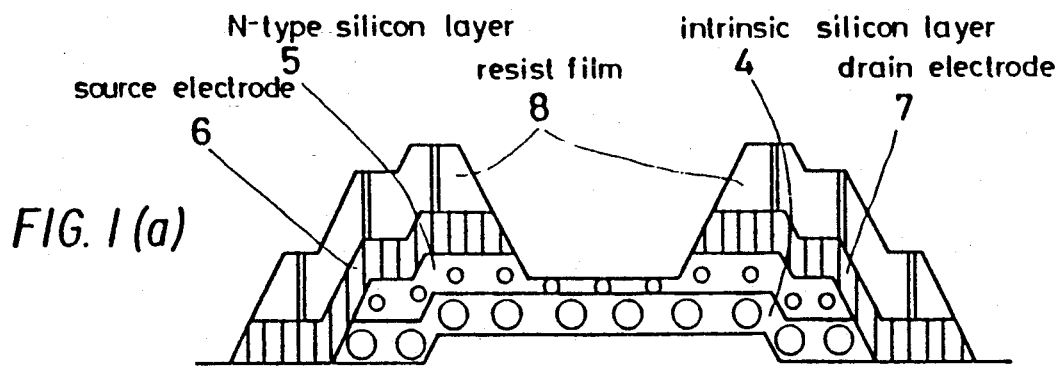
FIG. 1(a)
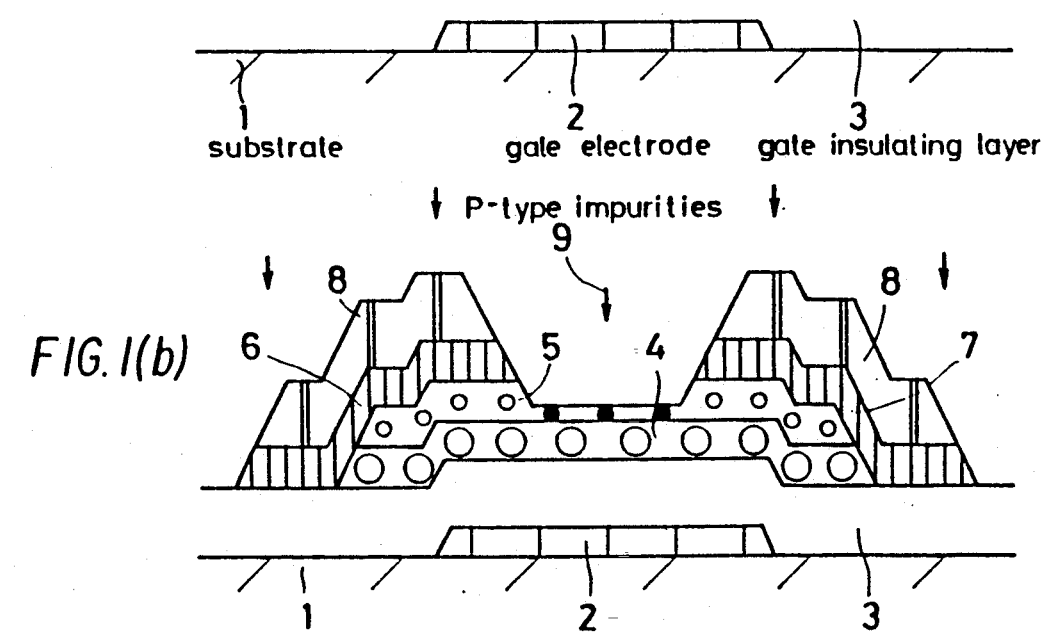
FIG. 1(b)
FIG. 1(c)

METHOD FOR PRODUCING REVERSE STAGGERED TYPE SILICON THIN FILM TRANSISTOR

BACKGROUND OF THE INVENTION:

The present invention relates to a method for producing a reverse type silicon thin film transistor used in an active matrix type liquid crystal display device or a photosensor.

Research and development of a reverse staggered type silicon thin film transistor has been conducted in order to use the same in an active matrix type liquid crystal display device and a photosensor.

Such a reverse staggered type silicon thin film transistor is shown in FIG. 3 and an explanation will now be given as to the method of producing the same.

In a conventional production method, a gate insulating layer 3 is formed on a substrate 1 having a gate electrode 2. An intrinsic silicon layer 4 containing almost no impurities in the transistor-forming part thereof is then formed on gate insulating layer 3, and an n-type silicon layer 5 containing n-type impurities is formed on intrinsic silicon layer 4. On the thus-formed incomplete transistor, n-type silicon layer 5 is etched by using source electrode 6 and drain electrode 7 as the mask, so as to render source electrode 6 and drain electrode 7 non-conductive by means of n-type silicon layer 5.

Since fluctuation of the degree of etching occurs in substrate 1 when etching n-type silicon layer 5, intrinsic silicon layer 4 is simultaneously etched as shown in FIG. 3 to remove the n-type silicon layer thereat.

When forming n-type silicon layer 5 on intrinsic silicon layer 4, since the n-type impurities in n-type silicon layer 5 diffuse into intrinsic silicon layer 4, the upper part of intrinsic silicon layer 4 is formed as an n-type layer.

Also, there is almost no selectivity of etching between n-type silicon layer 5 and intrinsic silicon layer 4. Therefore, in order to remove the n-type upper part of silicon layer 4 in all transistors on the substrate, it is necessary to etch silicon layer 4 down to a considerabe depth.

However, when the etching is excessive, due to damage or the like to silicon layer 4, the on-current is lowered, and/or source electrode 6 and drain electrode 7 overhang silicon layer 4 at the terminal parts of source electrode 6 and drain electrode 7 such that cracks may form therein.

On the other hand, when the etching is not carried out sufficiently, complete removal of the n-type upper part of silicon layer 4 is impossible, so that the off-current increases.

In the conventional production method, control of the above-described etching is very difficult, such that a transistor with good reproducibility cannot be formed.

SUMMARY OF THE INVENTION:

The present invention takes into account the above-described problems, and has an object of providing a method for producing a reverse staggered type silicon thin film transistor with good reproducibility.

BRIEF DESCRIPTION OF THE DRAWINGS:

FIGS. 1(a)–1(c) are cross-sectional views of a reverse staggered silicon thin film transistor and a method for producing the same, according to the present invention; reverse staggered

Figure 2A:
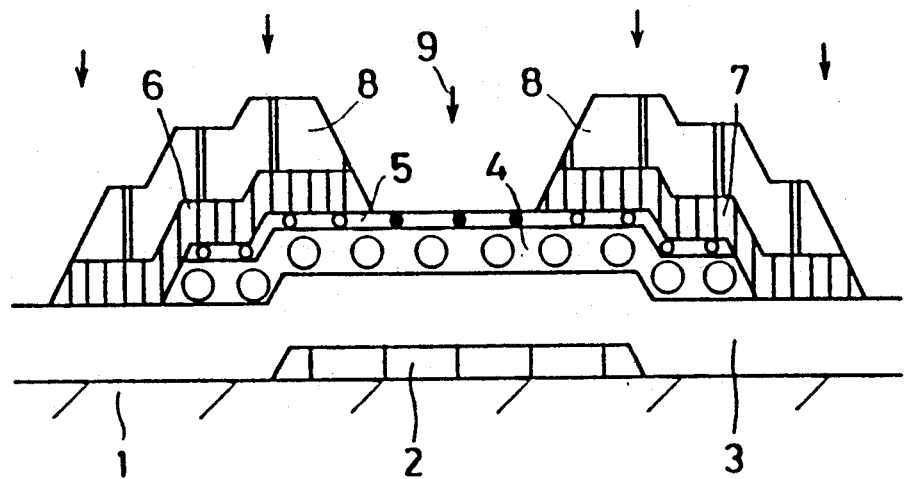
FIGS. 2(a) and 2(b) are cross-sectional views of a silicon thin film transistor and a method for producing the same, according to another embodiment of the present invention.

DESCRIPTION OF THE PREFERRED EMBODIMENTS:

Referring to the drawings in detail, and initially to FIG. 1(a), a reverse staggered type silicon thin film transistor according to the present invention includes a substrate 1 having a gate electrode 2, a gate insulating layer 3 thereon, an intrinsic silicon layer 4 formed of amorphous silicon on gate insulating layer 3, an n-type silicon layer 5 containing n-type impurities on intrinsic silicon layer 4, a source electrode 6 and a drain electrode 7 formed of ITO (indium tin oxide) thereon, a resist film 8 on electrodes 6 and 7, and boron P-type impurities 9.

The above-described n-type silicon layer 5 is of the type having a part thereof formed in a film and a part thereof with n-type impurities diffused in intrinsic silicon layer 4.

An explanation of the production method will now be given by referring to FIGS. 1(a), 1(b), and 1(c).

As shown in FIG. 1(a), an incomplete transistor is formed with a gate insulating layer 3 on a substrate 1 having a gate electrode 2, an intrinsic silicon layer 4 on gate insulating layer 3, an n-type silicon layer 5 on intrinsic silicon layer 4, and a source electrode 6 and drain electrode 7. A resist film 8 has the shape of source electrode 6 and drain electrode 7 and is formed thereon. Further, n-type silicon layer 5 is etched by using resist film 8 as a mask by means of a plasma dry etching method with a $CF_4$ system gas.

In this case, it is not necessary to etch all of the above-described n-type silicon layer 5.

Therefore, since it is not required to etch intrinsic silicon layer 4, the heretofore-observed overhang at the terminal parts of source electrode 6 and drain electrode 7 is not present, and cracks are not generated. Furthermore, since the film thickness of intrinsic silicon layer 4 can be made thin, the off-current of the transistor can be decreased.

As shown in FIG. 1(b), P-type impurities 9 are doped to n-type silicon layer 5 by using the above-described resist film 8 as a mask, and the doped part of n-type silicon layer 5 is made intrinsic or into a P-type layer.

There is no hindrance in effecting that the above-described P-type impurities be doped on the upper part of intrinsic silicon layer 4.

As a method for doping, it is, for example, preferable that the plasma discharge method be used with $B_2H_6$ (diborane) gas and the like, but an ion shower method, ion implantation method, and the like may also be used.

As described above, even if fluctuations in the depth of etching occur in the above-described procedure of FIG. 1(a), n-type silicon layer 5 can be surely made intrinsic or of a P-type by doping P-type impurities so that the characteristics of the transistor in the substrate become uniform, and moreover, transistor characteristics with good reproducibility can be obtained.

Thereafter, as shown in FIG. 1(c), the resist film 8 is removed.

In the above-described embodiment, although the etching of n-type silicon layer 5 or the doping of the P-type impurities has been effected by using resist film 8 as a mask, source electrode 6 and drain electrode 7 may be used as such a mask. However, there are many cases wherein ITO is used in the above-described source electrode 6 and drain electrode 7, wherein there is a problem that the ITO is reduced when doping the P-type impurities by the above-described discharge method, by the reducing substance (hydrogen, for example) in the discharge gas. Therefore, it is preferable that resist film 8 is used as a mask as in the case of the above-described embodiment.

Figure 2B:
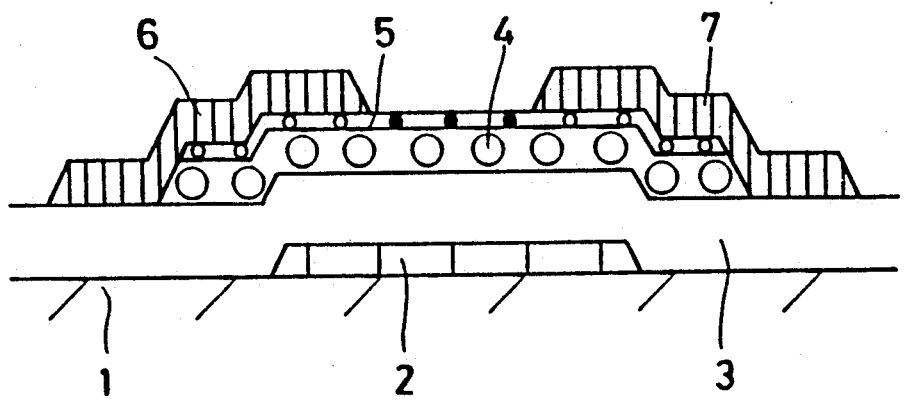
Figure 3:
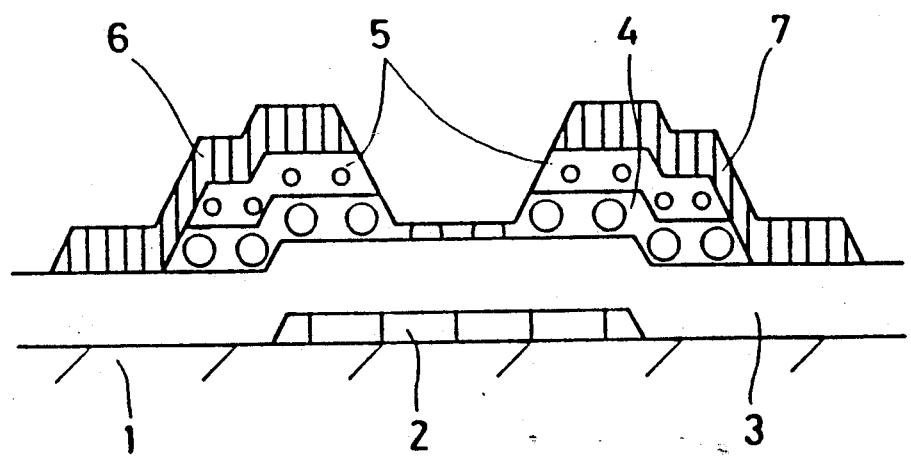
FIG. 3 is a cross-sectional view of a conventional reverse staggered type silicon thin film transistor.

FIGS. 2(a) and 2(b) show another embodiment of the present invention, and an explanation of the production method will be given by referring to these figures.

An incomplete transistor is shown in FIG. 2(a), wherein a gate electrode 2 is formed on a substrate 1, and a gate insulating layer 3 is formed thereon. An intrinsic silicon layer 4 is formed at the transistor forming part, on gate insulating layer 3, and an n-type silicon layer 5 is formed on intrinsic silicon layer 4. Further, a source electrode 6 and a drain electrode 7 are formed thereover, along with a resist film 8 having the same shape as source electrode 6 and drain electrode 7. P-type impurities 9 are doped to n-type silicon layer 5 by using the above-described resist film 8 as a mask, and the doped part of n-type silicon layer 5 is made intrinsic or of the P-type. In this embodiment, there is substantially no hindrance to the above-described impurities being doped to the upper part of intrinsic silicon film 4.

In the embodiment of FIGS. 2(a) and 2(b), the procedure for etching n-type silicon layer 5 as in the above-described first embodiment is not present. Therefore, it is preferable to make the thickness of the film-forming part about 10 nm.

As the method for doping, a method similar to that used in the above-described first embodiment can be used.

Although the doping of P-type impurities 9 may be effected by using source electrode 6 and drain electrode 7 as the mask instead of using resist film 8, since the above-described source electrode 6 and drain electrode 7 are made of ITO, it is preferable to use resist film 8 as a mask to effect the doping in a reducing atmosphere in order to avoid the problem of reducing the ITO.

Thereafter, as shown in FIG. 2(b), the resist film 8 is removed.

In the present embodiment, since n-type silicon layer 5 is not etched, the production procedure is simplified, and together with the fact that there is no fluctuation due to the etching, the characteristics of the transistor in the substrate become uniform. Moreover, transistor characteristics with good reproducibility can be obtained. Also, the overhang at the terminal parts of the source electrode and drain electrode such as heretofore discussed is not present and cracks and the like do not occur. Furthermore, it becomes possible to make the film thickness of intrinsic silicon layer 4 thinner than that in the above-described first embodiment, and the off-current of the transistor can be further reduced. It is further noted that in the above-described two embodiments, other than amorphous silicon, polysilicon or the like can be used in silicon layer 4.

In the present invention, therefore, n-type silicon layer 5 remains, that is, since the intrinsic silicon layer 4 is not etched fundamentally, the fluctuation of the film thickness after etching n-type silicon layer 5 and intrinsic silicon layer 4 is less in comparison with that in the conventional cases. Moreover, since n-type silicon layer 5 can be completely made intrinsic or can be of the P-type by doping P-type impurities 9, the characteristics of the transistor in the substrate become uniform, and transistor characteristics with good reproducibility can be obtained.

Also, the heretofore discussed overhang at the terminal parts of source electrode 6 and drain electrode 7 is reduced or eliminated, and cracks do not occur.

Further, since the film thickness of intrinsic silicon layer 4 can be made thin, the off-current of the transistor can be decreased.

In particular, in the transistor produced by the second embodiment procedure without etching of n-type silicon layer 5, the above-described effects become further enhanced and the production yield is increased due to the decrease of procedures.

Having described specific preferred embodiments of the invention with reference to the accompanying drawings, it will be appreciated that the present invention is not limited to these specific preferred embodiments, and that changes and modifications can be made by one of ordinary skill in the art without departing from the spirit or scope of the inventon as defined by the appended claims.

What is claimed is:

1. A method for producing a reverse staggered type silicon thin film transistor, comprising the steps of:
   forming a gate electrode on a surface of a substrate, and forming a gate insulating layer on said substrate and gate electrode;
   forming an intrinsic silicon film on a predetermined portion of the gate insulating layer overlying said gate electrode and extending beyond said gate electrode;
   forming an n-type silicon layer on said intrinsic silicon layer to cover said predetermined portion thereof;
   forming a source electrode and a drain electrode to overlie a first portion of said n-type silicon layer; and
   doping a second portion of said n-type silicon layer other than said first portion thereof with p-type impurities by means of a mask.

2. A method according to claim 1; wherein said step of doping includes the step of using said source electrode and said drain electrode as the mask.

3. A method according to claim 1; wherein said step of doping includes the step of using a resist layer formed on said source electrode and drain electrode as the mask.

4. A method according to claim 1; wherein said step of doping includes the step of forming said doped n-type silicon layer into an intrinsic layer.

5. A method according to claim 1; wherein said step of doping includes the step of forming said doped n-type silicon layer into a p-type layer.

6. A method for producing a reverse staggered type silicon thin film transistor, comprising the steps of:
   forming a gate electrode on a surface of a substrate, and forming a gate insulating layer on said substrate and gate electrode;
   forming an intrinsic silicon film on a predetermined portion of the gate insulating layer that overlays said gate electrode and extends beyond said gate electrode;

forming an n-type silicon layer on said intrinsic silicon layer to cover said predetermined portion thereof;

forming a source electrode and a drain electrode to overlie a first portion of said n-type silicon layer;

subsequently removing a portion of said n-type silicon layer not covered by said source and drain electrodes by means of a mask, such that there remains a predetermined thickness of said n-type silicon layer; and doping said predetermined thickness of said n-type silicon layer with p-type impurities by means of a mask.

7. A method according to claim 6; wherein said step of removing includes the step of using said source electrode and said drain electrode as the mask.

8. A method according to claim 6; wherein said step of removing includes the step of using a resist layer formed on said source electrode and drain electrode as the mask.

9. A method according to claim 6; wherein said step of doping includes the step using said source electrode and said drain electrode as the mask.

10. A method according to claim 6; wherein said step of doping includes the step of forming said doped n-type silicon layer into an intrinsic layer.

11. A method according to claim 6; wherein said step of doping includes the step of forming said doped n-type silicon layer into a p-type layer.

12. A method according to claim 6; wherein said step of doping includes the step of using a resist layer formed on said source electrode and drain electrode as the mask.

13. A method according to claim 12; wherein said step of doping includes the step of forming said resist layer to have the shape of the source electrode and the drain electrode.

* * * * *